United States Patent
Sadot et al.

(10) Patent No.: US 10,404,367 B2
(45) Date of Patent: Sep. 3, 2019

(54) LOW RESOLUTION ADC-DSP OPTIMIZATION BASED ON NON-UNIFORM QUANTIZATION AND MLSE FOR DATA CENTERS INTERCONNECTS

(71) Applicant: B.G. NEGEV TECHNOLOGIES AND APPLICATIONS LTD., AT BEN-GURION UNIVERSITY, Beer Sheva (IL)

(72) Inventors: Dan Sadot, Kfar Bilu (IL); Yaron Yoffe, Rishon Lezion (IL)

(73) Assignee: B.G. Negev Technologies and Applications Ltd., at Ben-Gurion University, Beer Sheva (IL)

( * ) Notice: Subject to any disclaimer, the term of this patent is extended or adjusted under 35 U.S.C. 154(b) by 0 days.

(21) Appl. No.: 16/068,145

(22) PCT Filed: Jan. 6, 2017

(86) PCT No.: PCT/IL2017/050021
§ 371 (c)(1),
(2) Date: Jul. 5, 2018

(87) PCT Pub. No.: WO2017/118987
PCT Pub. Date: Jul. 13, 2017

(65) Prior Publication Data
US 2019/0013864 A1 Jan. 10, 2019

Related U.S. Application Data

(60) Provisional application No. 62/275,269, filed on Jan. 6, 2016.

(51) Int. Cl.
*H04B 10/079* (2013.01)
*H03M 13/37* (2006.01)
(Continued)

(52) U.S. Cl.
CPC .... *H04B 10/0795* (2013.01); *H03M 13/3723* (2013.01); *H03M 13/612* (2013.01);
(Continued)

(58) Field of Classification Search
CPC combination set(s) only.
See application file for complete search history.

(56) References Cited

U.S. PATENT DOCUMENTS

| 7,051,270 B2 | 5/2006 | Miyauchi et al. |
| 8,483,343 B2 * | 7/2013 | Agazzi ............ H03M 1/0626 375/229 |

(Continued)

FOREIGN PATENT DOCUMENTS

WO  96/35284 A1  11/1996

OTHER PUBLICATIONS

Narasimha et al., BER-Optimal Analog-to-Digital Converters for Communication Links, Urbana, 51, p. 61801, May 31, 2010 (5 pages).

(Continued)

*Primary Examiner* — Omar S Ismail
(74) *Attorney, Agent, or Firm* — Roach Brown McCarthy & Gruber, P.C.; Kevin D. McCarthy

(57) ABSTRACT

A method for optimizing non-uniform quantization thresholds of an ADC in MLSE-based receivers in an optical communication channel, according to which a Quantized Noise (QN) distortion model, in which the quantization and the channel additive noises are combined is generated. The model is applied on the channel deterministic analog states x(n) and on sequences of analog states and transition probabilities are calculated, which will be used later on to calculate the BER, from channel deterministic states and sequences of channel deterministic states into the discrete ADC quantization regions. Real value outputs of the ADC (Continued)

are replaced by the transition probabilities and non-uniform quantization of the ADC is performed, with thresholds that are optimized for MLSE detection, to obtain maximal statistical separation. A DSP circuit computes, the MLSE metrics and the transition probabilities of the analog states into the quantized values, for each of the channel deterministic state; and an MLSE decoder post-processes transition probabilities replacing the ADC outputs and representing analog regions, based on the derived transition probabilities.

16 Claims, 7 Drawing Sheets

(51) Int. Cl.
  *H03M 13/00* (2006.01)
  *H04L 1/00* (2006.01)
  *H04L 1/20* (2006.01)
(52) U.S. Cl.
  CPC .......... *H03M 13/6577* (2013.01); *H04L 1/00* (2013.01); *H04L 1/203* (2013.01)

(56) References Cited

U.S. PATENT DOCUMENTS

| | | | | |
|---|---|---|---|---|
| 2006/0274861 | A1* | 12/2006 | Langenbach | H04L 25/03197 375/341 |
| 2007/0133722 | A1* | 6/2007 | Agazzi | H03M 1/0626 375/346 |
| 2009/0196380 | A1 | 8/2009 | Anekoji | |
| 2010/0128809 | A1* | 5/2010 | Maeda | H04L 25/03248 375/262 |
| 2011/0211842 | A1* | 9/2011 | Agazzi | H04B 10/6971 398/141 |
| 2012/0275780 | A1* | 11/2012 | Hueda | H04L 25/0202 398/25 |
| 2013/0124948 | A1* | 5/2013 | Stojanovic | H04L 25/03184 714/796 |
| 2015/0043926 | A1* | 2/2015 | Levy | H04B 10/60 398/202 |

OTHER PUBLICATIONS

Gorshtein et al., Blind channel estimation of MLSE receiver in high speed optical communications, theory and ASIC implementation. Optics express, 21 (19):21766-89, Sep. 23, 2013 (24 pages).
Washwa, Scalable Front End Designs for Communication and Learning, PhD Diss., Univ. of California, Dec. 31, 2014 (2 pages).
Yoffe et al., DSP-Enhanced Analog-to-Digital Conversion for High-Speed Data Centers Optical Connectivities, IEEE Pohotnics Journal 7, No. 4, 2015 1-13, Jul. 31, 2015 (14 pages).
Dabeer et al., On the Limits of Communication with Low-Precision Analog-to-Digital Conversion at the Receiver, Singh J. et al., Dec. 11, 2009 (5 pages).
International Search Report for PCT/IL2017/050021; dated Apr. 5, 2017 (4 pages).
Written Opinion of the International Searching Authority for PCT/IL2017/050021; dated Apr. 5, 2017 (5 pages).

* cited by examiner

LOW RESOLUTION ADC-DSP OPTIMIZATION BASED ON NON-UNIFORM QUANTIZATION AND MLSE FOR DATA CENTERS INTERCONNECTS

FIELD OF THE INVENTION

The present invention relates to the field of optical data networks. More particularly, the invention relates to a method for thresholds quantization of an ADC, which is optimized for MLSE-based receivers.

BACKGROUND OF THE INVENTION

Over the last few years, bandwidth requirement of data centers optical interconnection has grown tremendously. Accelerated global internet usage, as well as newly emerging cloud computing, big data and social media applications results in massive capacity requirement of both intra-connections between switches (e.g., top of the rack switches) inside the data-centers element, as well as external interconnections between different data-centers locations. These optical connections are expected to scale up in speed, and support ultra-high data rates (i.e., 100 Gbit/sec and beyond) under severe constrains of power consumption and cost. In particular, the proposed solutions should be based on existing infrastructure, which includes low-costs and severely bandlimited opto-electronic components such as Digital-to-Analog-Converters (DACs), electrical drivers, modulators, optical receivers and Analog-to-Digital Converters (ADCs).

One of the existing solutions is a system which incorporates DSP dedicated Integrated Circuits (ICs), which can effectively compensate for the optical fiber and opto-electronic devices impairments. Such system architecture provides a cost effective solution, as it leverages on Moore's 'law' for low-cost, low-power consumption and high speed implementation, instead of introducing costly wide-bandwidth opto-electronic components. It was demonstrated that Maximum-Likelihood Sequence Estimation (MLSE) can effectively mitigate the Inter-Symbol-Interference (ISI) resulting from system bandwidth limitation, as well as for different impairments of the optical fiber.

However, a major bottleneck in such a system design is the high-speed and high-resolution ADC device that should meet the system demands. As the analog bandwidth increases, the complexity of high-resolution ADCs circuitry is scaling drastically, resulting in excessive power consumption and extremely high costs. In addition, high-resolution ADCs require corresponding high resolution DSP units, which also increase the system complexity.

One way to overcome this technological challenge is to reduce the ADCs Physical Number Of Bits (PNOB) and thus significantly decrease the amount of electronic hardware (and accordingly the power dissipation, occupied area on an integrated circuit and cost). For example, saving 2 bits saves approximately 75% of the power consumption. However, this solution introduces large quantization distortions, which may seriously degrade the Bit-Error-Rate (BEP) performance.

Typically the ADCs are based on uniform quantization, i.e. the threshold and output levels are uniformly distributed within the signal dynamic range. When the quantization is sufficiently fine, the quantization distortion can be modeled as uniformly distributed white noise and incorporated into the BER analysis. However, in case of low-resolution quantization (1-4 bits), the distortion becomes severe, non-linear, and deviates from the additive noise model. In turn, the effect of BER performance is less predictable, and strongly depends on the calibration of the quantization thresholds and output values.

It is therefore desirable by using DSP techniques, to allow using low-resolution, low cost and low power consumption ADCs, while improving BER performance over conventional designs for datacenter interconnects.

It is an object of the present invention to provide a method for thresholds quantization of an ADC, which is optimized jointly with the MLSE-based receivers.

It is another object of the present invention to provide a method for thresholds quantization of an ADC in MLSE-based receivers, which is optimized according to minimum BER performance.

It is a further object of the present invention to provide a method for thresholds quantization of an ADC, which allows reducing its number of bits without affecting the system BER performance.

Other objects and advantages of the invention will become apparent as the description proceeds.

SUMMARY OF THE INVENTION

The present invention is directed to a method for optimizing non-uniform quantization thresholds of an ADC in MLSE-based receivers in an optical communication channel, comprising the following steps:
a) generating a Quantized Noise (QN) distortion model (that; may be defined using transition of probabilities from analog values into quantization regions), in which the quantization (which may be represented as a deterministic impairment operating on a noisy signal) and the channel additive noises are combined;
b) applying the model on the channel deterministic analog states x (n) and on sequences of analog states;
c) calculating transition probabilities, which will be used later on to calculate the BER, from channel deterministic states and sequences of channel deterministic states into the discrete ADC quantization regions;
d) replacing real value outputs of the ADC by the transition probabilities;
e) performing non-uniform quantization of the ADC, with thresholds that are optimized for MLSE detection, to obtain maximal statistical separation (resulting in minimum BER);
f) computing, by a DSP circuit, the MLSE metrics and the transition probabilities of the analog states into the quantized values, for each of the channel deterministic states; and
g) using an MLSE decoder for post-processing transition probabilities replacing the ADC outputs and representing analog regions, based on the derived transition probabilities.

The DSP circuit is adapted to perform the following steps:
a) generating the conditional PDFs engines for the MLSE;
b) computing the transition probabilities from x to r, based on the probability of $y(n)=x(n)+z(n)$ falling within a specific region r; (quantization bin), and is derived by the probability mass of $y(n)$, accumulated in each of the regions; and
c) computing the transition probabilities from sequences $x^{(j)}=(x_1^{(j)}, x_2^{(j)} \ldots x_N^{(j)})$ to $R^{(j)}, r_1^{(j)}, r_2^{(j)} \ldots r_N^{(j)}$, as described in the preceding step.

Quantization may be optimized for minimum BER by the following steps:

a) performing a pattern search over all possible thresholds combination, for narrowing down the possible range of values of each of the thresholds.

b) performing iterative local optimizations, using the gradient decent algorithm, to iteratively determine the optimal thresholds.

The pattern search and the iterative local optimizations may be performed on a target function that incorporates all possible errors or the error with the highest probability. These two options represent a tradeoff between accuracy and computational complexity.

The calculation of the MLSE metrics may be based on probability mass of a region, while excluding the arithmetic values of the ADC outputs from calculation. This way, the optimization may be simplified.

The ADC may have non-uniform thresholds which are optimized by minimum BER criterion of the combination of the ADC followed by the MLSE receiver.

The present invention is also directed to an MLSE-based receiver of an optical communication channel, which comprises:

a) an ADC for receiving discrete-time analog values of the received signal, which includes additive noise;

b) a DSP circuit, for optimizing non-uniform quantization thresholds of the ADC by:

b.1) generating a Quantized Noise (QN) distortion model, in which the quantization and the channel additive noises are combined;

b.2) applying the model on the channel deterministic analog states x(n) and on sequences of analog states;

b.3) calculating transition probabilities from channel deterministic states and sequences of channel deterministic states into the discrete ADC quantization regions;

b.4) replacing real value outputs of the ADC by the transition probabilities;

b.5) performing non-uniform quantization of the ADC, with thresholds that are optimized for MLSE detection, to obtain maximal statistical separation;

b.6) computing, the MLSE metrics and the transition probabilities of the analog states into the quantized values, for each of the channel deterministic states; and c) an MLSE decoder for post-processing transition probabilities replacing the ADC outputs and representing analog regions, based on MLSE metrics, derived by the DSP circuit, from the calculated transition probabilities.

DETAILED DESCRIPTION OF PREFERRED EMBODIMENTS

Figure 1:
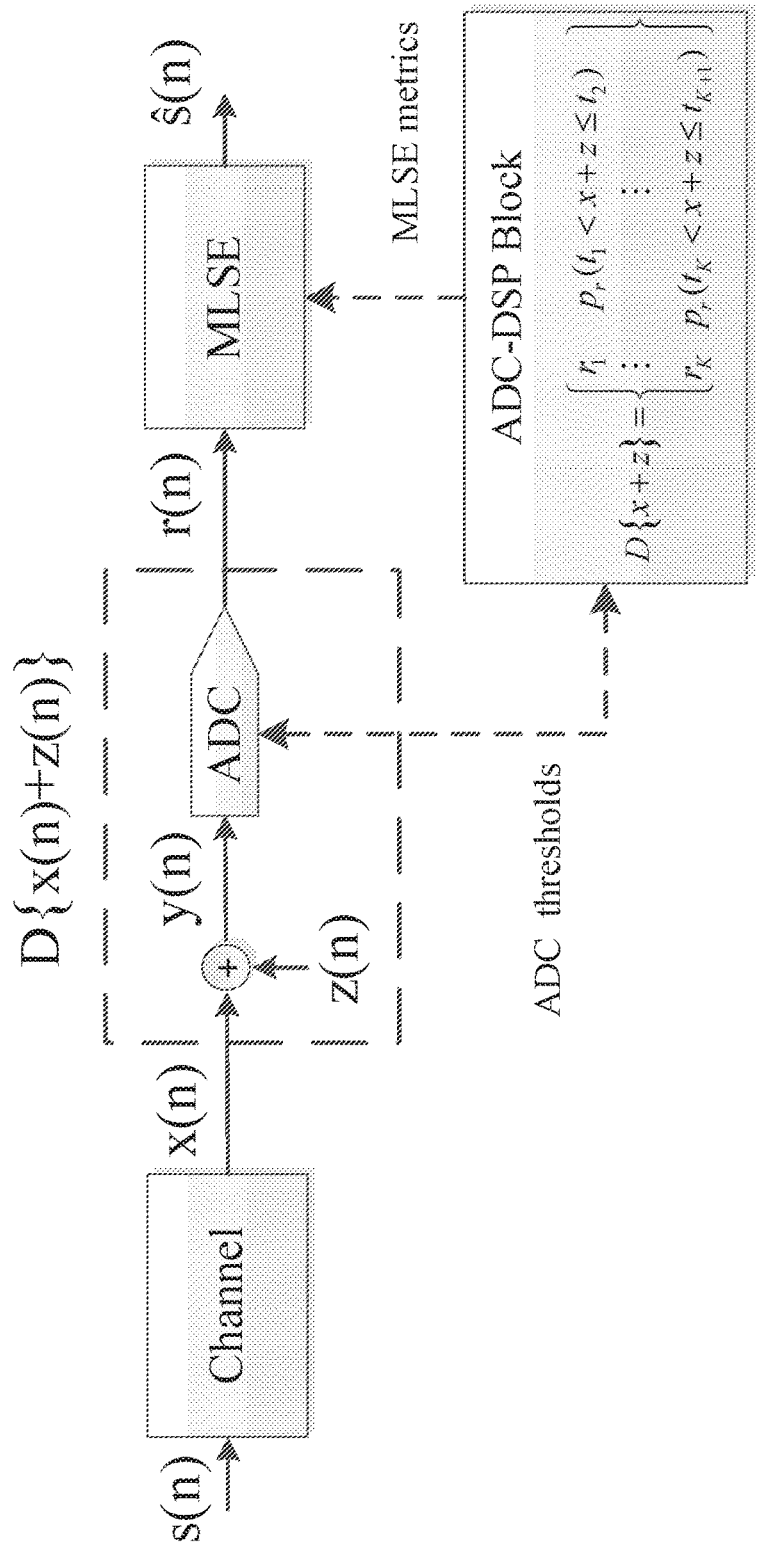
FIG. 1 illustrates a combined ADC-DSP system model, proposed by the present invention.

The present invention proposes a combined ADC-DSP scheme, based on a novel non-uniform quantization method, optimized for MLSE based receivers. This optimization enables using extremely low-resolution analog-to-digital-converters devices, which form a major bottleneck in high speed optical communications receivers' architecture. The proposed method significantly improves BER over conventional designs, and may provide low cost and low power consumption digital implementation solution for datacenter interconnects.

The proposed method is optimized for MLSE based receivers. By adopting a combined noise and quantization (QN) distortion model, the effect of ADC thresholds calibration on the BER performance is derived. This model of the analog signal that is sampled by the ADC includes a noise-related error (e.g., Gaussian noise), enables the incorporation of the low-resolution and non-uniform quantization non-linearity into the BER computation, such that inclusive optimization could be performed directly on the BER target function. Through Monte Carlo simulations, it was demonstrated that the proposed method substantially improves the BER vs SNR curve, with significant gain over existing methods. This may enable the use of low cost and low power consumption ADC components, which is critical for the development of next generation datacenters connectivity.

The present invention proposes a novel low-resolution and non-uniform quantization method, which is optimized for MLSE based receivers. The non-uniform quantization allows better utilization of the quantization bits, as the threshold levels are determined based on the signal statistics. Differ from conventional non-uniform quantizers such as the Lloyd-Max (LM) quantizer (a non-uniform quantizer, which is adapted to the signals Probability Density Function. It basically minimizes the expectation of the quanization power, given the Probability Density Function of the signal to quantize), here the optimization is based on detection criterion (BER) instead of the Mean-Squared-Error (MSE) metric. In order to incorporate the precise effect of ADC thresholds calibration on the BER performance, an inclusive distortion model is introduced which considers the combined effect of the channel deterministic impairments, additive noises, and ADC quantization. This Quantized Noise (QN) model is based on transition probabilities from the channel deterministic states into the discrete ADC quantization regions (or quantization intervals called "bins") which will be used later on to calculate the BER, rather than on arithmetic errors that are based on real-valued ADC outputs. This enables the optimization of a non-uniform quantization scheme, such that maximal statistical separation between different paths on the MLSE receiver trellis diagram is achieved. The maximal statistical separation results in minimum BER.

Although the concept of BER optimal ADC is already described in "BER-Optimal Analog-to-Digital Converters for Communication Links" (Minwei et al, Signal Processing, IEEE Transactions, vol.60, No.7, pp. 3683-3691, July 2012), the optimization proposed by the present invention is based on different criterion and is specifically designed for MLSE detection, taking advantage of its inherent robustness to non-linear distortions, and its ability to compensate for signal-dependent patterns. The quantization is treated as a highly non-linear impairment, and the thresholds are optimized inclusively with the MLSE detector to allow sequence detection with minimal errors.

Quantization—Additive White Noise Versus Non-Linear Distortion

The purpose of quantization is mapping continuous analog signals into a finite set of values. The ADC dynamic range is divided into regions $\{r_i\}_{i=1}^{K}$, which are separated by analog thresholds $\{t_i\}_{i=1}^{K+1}$, and are represented with real-valued numbers (ADC outputs). The number of regions is determined by the number of quantization bits B and is given by $K=2^B$.

Without loss of generality, the quantization distortion can be modeled as the difference between the sampled ADC input and the corresponding quantized value:

$$q(n)=y(n)-D\{y(n)\} \quad \text{Eq. (1)}$$

Where y(n) is the received sampled signal, D{•} refers to the quantization function, and D{y(n)} is the corresponding ADC output value.

In ADC based digital receivers, quantization distortion and its effect on the system performance were already described, especially with respect to uniform quantizers. Known analysis provided for quantization noise demonstrates that under certain condition, the distortion can be characterized as an additive noise, uniformly distributed and uncorrelated with the input. This condition is mathematically well established and depends on the quantization step size Δ, which is the analog distance between the thresholds, i.e., the size of each quantization bin. Conversely, the condition can be manifested in relation to the bandwidth of the characteristic function $\Phi_x(u)$, which is the Fourier transform of the analog signal probability density function (PDF). A sufficient condition is given by:

$$\Phi_x(u) = 0 \text{ for } |u| > \frac{2\pi}{\Delta} \quad \text{Eq. (2)}$$

Once this condition is met, and the additive noise model is valid, the quantization noise variance is approximately given by $$\sigma_q^2 = \frac{\Delta^2}{12}$$

and the signal-to-quantization-noise ratio (SQNR) can be approximated as follows:

$$SQNR = 6.02B + 4.8 - 20\log_{10}\frac{R}{2\sigma_y} \quad \text{Eq. (3)}$$

Where R is the input signal dynamic range and $\sigma_y$ is its variance. In this case, the degradation in BER performance can be analytically computed in intensity modulation signals, complex constellations and in linearly equalized channels, The solution proposed by the present invention is mostly directed to low-resolution ADCs and non-uniform quantizers, in which the condition above is not satisfied. Consequently, the quantization effect generates signal dependent patterns, as there is a correlation between the input and the error signal of Eq. (1). This indicates that the distortion cannot be analyzed in terms of random independent noises. Instead, it should be treated as a deterministic, non-linear impairment. Subsequently, the MLSE decoder can be applied to mitigate the non-linear effect on the BER performance. Prior art methods have not provided analytic modeling of low-resolution and non-uniform quantization. Furthermore, their effect on the communication system performance has not been modeled, as well Error Probability of MLSE Receiver in the Presence of Low Resolution and Non-Uniform Quantization An analysis of BER performance in the presence of low-resolution and non-uniform quantization, followed by MLSE equalizer is described below. In order to incorporate the effect of the quantization non-linearity, explained above, an alternative statistical Quantized Noise (QN) channel model is used to perform inclusive optimization, in order to minimize the BER.

The first step of the analysis is observing the well-known general expression which provides a tight upper bound and a close approximation for the error probability in MLSE based detectors:

$$P_{er} \leq \sum_{\varepsilon} W_H(\varepsilon)P(\varepsilon) = \sum_{\varepsilon} W_H(s_i \neq s_j)P(s_i | s_j)P(s_j) \quad \text{Eq. (4)}$$

Where ε refers to an error event, $W_H(\varepsilon)$ is the corresponding Hamming weight (the number of symbols that are different from the zero-symbol), or the number of symbol errors. $P(s_i|s_j)$ is the probability of a error event, where $s_j$ and $s_i$ are the transmitted and decoded sequences respectively, and $P(s_j)$ is the a-priory probability that the sequences $s_j$ was transmitted. Assuming a channel with ISI and AWGN, each ADC sample can be modeled as a sum of a deterministic analog state x(n) and additive noise z(n):

$$y(n)=x(n)+z(n) \quad \text{Eq. (5)}$$

Consequently the term $P(s_i|s_j)$ in Eq. (4) is defined by the Euclidean norm associated with the error event ε:

$$P(s_i | s_j) = Q\left(\frac{\|x_i - x_j\|}{2\sigma_z}\right) \quad \text{Eq. (6)}$$

Where $x_i=(x_1, x_2 \ldots x_N) \in R^N$ and $x_j=(x_1, x_2 \ldots x_N) \in R^N$ represent vectors of N consecutives deterministic analog states (noiseless) that correspond to the sequences $s_i$ and $s_j$ respectively. $\sigma_z$ is the Additive white Gaussian noise (AWGN—is a basic noise model used to mimic the effect of random noise). The modifiers denote specific characteristics: AWGN standard deviation and Q(•) represents the Gaussian Q function.

The analysis is focused on the incorporation of the effect of severe and non-uniform quantization. In this approach, the quantization function is combined with the channel additive noises and other random impairments into an inclusive distortion model, similarly to the approach used for the mutual information derivations in "On the limits of communication with low-precision analog-to-digital conversion at the receiver" J. Singh et al (IEEE Transactions on Commun., 57(12), 3629-3639, 2009).

FIG. 1 illustrates a receiving end of a communication channel that uses a combined ADC-DSP block which calculates the correct probability for each ADC threshold, as proposed by the present invention. The QN D {x(n)+z(n)} model is operating on the channel deterministic analog states x(n). The ADC outputs r(n), which represent analog regions, are post-processed by the MLSE for data detection. The ADC-DSP block computes the MLSE metrics and the transition probabilities from $x_i$ to $r_i$, for each of the channel states.

This generalized QN model, $D\{x+z\}=D\{y\}$, operates on the deterministic analog channel state x and is defined in terms of transition probabilities from the analog states into the quantized values, rather than in terms of arithmetic errors (the Euclidean norms in Eq. 6).

Since a large error is expected between the analog received signal y(n) and the quantized value $D\{y(n)\}$, $D\{y(n)\}$ will be assigned to an analog region r instead of the real-valued number of the ADC output by the ADC-DSP block, as shown in FIG. 1. The ADC-DSP block has a twofold operation:

(1) computation of the transition probabilities from x to r, as in Eq.7.

(2) generation of the conditional PDFs engines for the MLSE.

The computations are based on the probability of y(n)=x(n)+z(n) falling within a specific region $r_i$ (quantization bin), and is derived by the probability mass of y(n), accumulated in each of the regions:

$$P\{D\{y\} = r_i \mid x\} = \qquad \text{Eq. (7)}$$
$$P\{D\{x+z\} = r_i \mid x\} = p_r(x+z \in r_i) = p_r(t_i < x+z \le t_{i+1})$$

$$D\{y\} = D\{x+z\} = \begin{Bmatrix} r_1 & p_r(t_1 < x+z \le t_2) \\ r_2 & p_r(t_2 < x+z \le t_3) \\ \vdots & \vdots \\ r_K & p_r(t_K < x+z \le t_{K+1}) \end{Bmatrix},$$

where $\{r_i\}_{i=1}^{K}$ are the analog regions, and $\{t_i\}_{i=1}^{K+1}$ ($t_{1=-k+1}=\infty$) are the appropriate thresholds between the regions. In the case where z(n) is AWGN, the probabilities can be computed as follows:

$$p_r(y \in r_i \mid x) = \qquad \text{Eq. (8)}$$
$$\frac{1}{\sqrt{2\pi\sigma_z^2}} \int_{t_i}^{t_{i+1}} \exp\left(\frac{(y-x)^2}{2\sigma_z^2}\right) dy = Q\left(\frac{x-t_i}{\sigma_z}\right) - Q\left(\frac{x-t_{i+1}}{\sigma_z}\right)$$

Figure 2A:
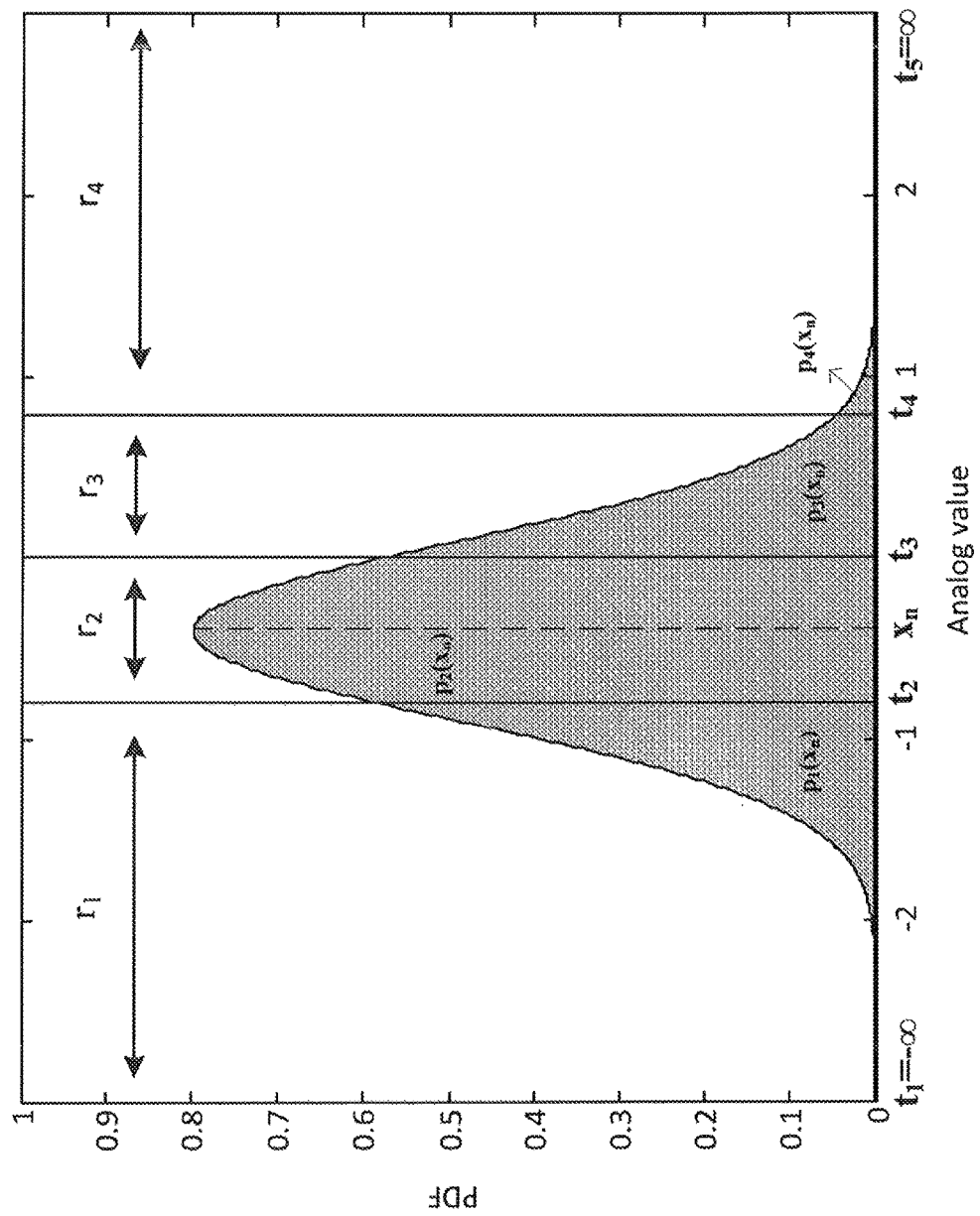
FIG. 2a illustrates a Probability Density Function vs. the analog value for a single ADC sample.

This is illustrated in FIG. 2a. Eq. (7) and Eq. (8) provide the relation between the transition probabilities and the calibrated. ADC thresholds, which are optimized by the ADC-DCP block.

Optimization Scheme

FIG. 2a illustrates a Probability Density Function (PDF-a function used to specify the probability of the random variable falling within a particular range of values) vs. The analog value for a single ADC sample $x=x_n$. Each of the channel states $x_i$ can be assigned to one of the four digital output values (assuming 2 bits quantization).

Figure 2B:
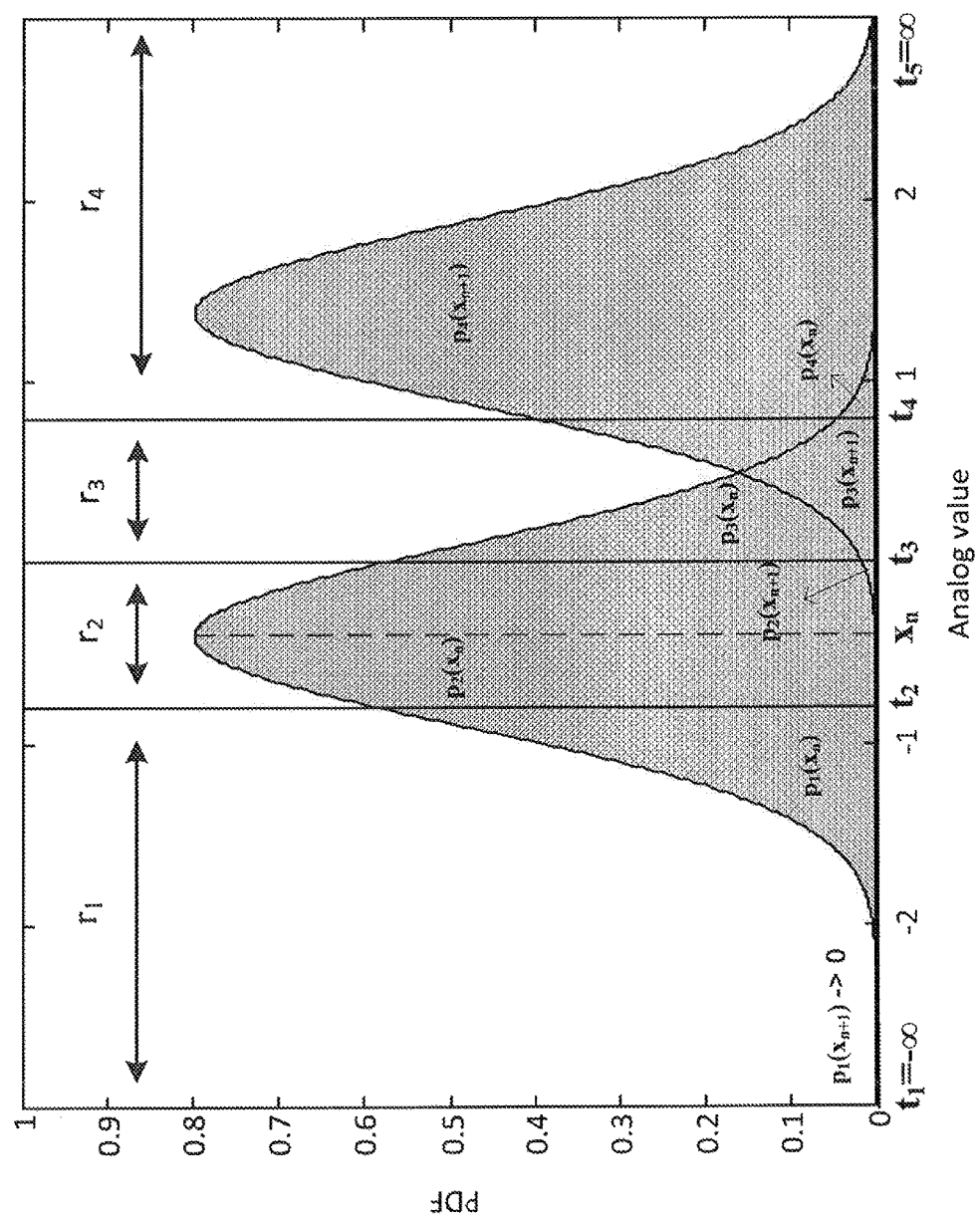
FIG. 2b illustrates a Probability Density Function (PDF) vs. the analog value for quantization of a sequence of 2 consecutive ADC samples.

FIG. 2b illustrates a Probability Density Function (PDF) vs. the analog value for quantization of a sequence of 2 consecutive ADC samples: $x=(x_n, x_{n+1})$.

Actually, the probabilistic mass is calculated as the area below the Gaussian noise graph in the relevant slice in a region of the ADC. This area replaces the numeric output of the ADC.

The area of the ADC may result from an analog value that has high probability, or from another analog value with low probability (i.e., close value with a high probabilistic mass or far value with a low probabilistic mass).

The probability to receive each value depends on the channel noises and the analog value of the state compared to the thresholds (reference levels $\{t\}_{i=1}^{4}$).

If a sequence of N consecutives values $y=(y_1,y_2 \ldots y_N)$ is quantized into one of the K regions, there would be $K^N$ different combinations. The quantization of a sequence of 2 consecutive samples is illustrated in FIG. 2b. The probability of an error event $P(s_i|s_j)$ can be determined as follows: the symbols sequences $s_j$ and $s_i$ are each assigned with $K^N$ conditional probabilities (conditional to the transmission of $s_i$ and $s_j$, respectively) for each possible combination. The decision between two sequences is made according to Maximum Likelihood (ML) criterion, i.e. the MLSE decoder decodes each of the combinations into one of the sequences, according to the highest conditional probability. An error evet occurs if the received samples of the sequence $s_j$ falls into a combination of regions that are assigned with the sequence $s_i$.

Although the MLSE decision criterion described above is known, the transformation from continuous noise representation into the inclusive QN model allows forming a methodology that depends on the regions (determined by the thresholds) and not on the arithmetic values. Consequently the combination of the QN model and MLSE enables the optimization of the quantization thresholds to achieve minimum BER.

Unlike prior art solutions (which are related to the ADC's numeric values, which is subject to coarse quantization error), the ADC-DSP block does not decide what is the ADC's numeric value, since it is not required to make a decision for the hit sequence.

For further explanations, the following notations are defined:

$x^{(j)}=(x_1^{(j)}, x_2^{(j)} \ldots x_N^{(j)})$ represents the analog deterministic channel states, associated with the sequence $s_j$.

$y^{(j)}=(y_1^{(j)}, y_2^{(j)} \ldots y_N^{(j)})$ are the corresponding analog received samples (including the channel noises and other random physical impairments such as clock jitter and fiber impairments). $D\{y^{(j)}\}$ refers to the digital quantized values (or regions). All the combinations of regions that are decoded into $s_j$ are denoted as $R^{(j)}=(r_1^{(j)}, r_2^{(j)} \ldots r_N^{(j)})$, and all the combinations of regions that are decoded into $s_i$ are denoted as $R^{(i)}=(r_1^{(i)}, r_2^{(i)} \ldots r_N^{(i)})$ such that $|R^{(i)}|+|R^{(j)}|=K^N$. The probability of an error event from $s_j$ to $s_i$ is a sum of probabilities such that $D\{y^{(j)}\} \in R^{(i)}$:

$$P(s_i \mid s_j) = \sum_{R^{(i)}} P(D\{y^{(j)}\} \in R^{(i)}) = \qquad \text{Eq. (9)}$$
$$\sum_{R^{(i)}} P(D\{y_1^{(j)}\} = r_1^{(i)} \cap D\{y_2^{(j)}\} = r_2^{(i)} \ldots \cap D\{y_N^{(j)}\} = r_N^{(i)})$$

Assuming independent noises, Eq. (9) can be rewritten as:

$$P(s_i \mid s_j) = \qquad \text{Eq. (10)}$$
$$\sum_{R^{(i)}} P(D\{y_1^{(j)}\} = r_1^{(i)}) \cdot P(D\{y_2^{(j)}\} = r_2^{(i)}) \ldots \cdot P(D\{y_N^{(j)}\} = r_N^{(i)})$$

Substituting Eq. (8) into Eq. (10) and Eq. (10) into Eq. (4) yields a closed form approximation for the BER, upper bound in case of low-resolution or non-uniform quantization in channels with memory and AWGN:

$$P_{er} \leq \sum_{\varepsilon} W_H(\varepsilon)P(\varepsilon) = \qquad \text{Eq. (11)}$$

$$\sum_{\varepsilon} W_H(s_i \neq s_j) \left\{ \sum_{R^{(i)}} P(D\{y_1^{(j)}\} = r_1^{(i)}) \cdot P(D\{y_2^{(j)}\} = r_2^{(i)}) \ldots \right.$$

$$\left. P(D\{y_N^{(j)}\} = r_N^{(i)}) \right\} P(s_j)$$

This computation in practical applications may become tedious, due to the large number of possible error events. Instead, and similarly to the non-quantized case, the computation may be simplified by focusing on the dominant term in the summation. The exponential dependence of each term in the sum causes the expression to be dominated by one of the error events, and the error probability can be approximated as follows:

$$P_{er} \leq \sum_{\varepsilon} W_H(\varepsilon)P(\varepsilon) \approx W_H(\varepsilon_{max}^{j \rightarrow i})P(\varepsilon_{max}^{j \rightarrow i}) \approx W_H(s_i \neq s_j) \qquad \text{Eq. (12)}$$

$$\left\{ \sum_{R^{(i)}} P(D\{y_1^{(j)}\} = r_1^{(i)}) \cdot P(D\{y_2^{(j)}\} = r_2^{(i)}) \ldots \cdot P(D\{y_N^{(j)}\} = r_N^{(i)}) \right\}$$

$$P(s_j)$$

Where $\varepsilon_{max}^{j \rightarrow i}$ is the error event with the highest probability (error from a sequence $s_j$ into the sequence $s_i$).

Optimizing the Quantization for Minimum BER

In the section above, an inclusive theoretical analysis of the BER at the output of the receiver based on low resolution non-uniform quantization and MLSE detector has been derived. This BER expression can be used as an ultimate optimization criterion, which allows analytical computation of the thresholds levels that result in minimum BER. Generally, in communication systems the analog value at the input to the ADC is less important. More important is to know which bits were transmitted. Therefore, the minimum BER criterion (i.e., minimal bit error) is more important and is used by the present invention, to be optimized to MLSE. The decision (which is optimized) is where to put the thresholds (and not what was the sampled analog value).

For example, if the transmitted sequences are "0000" followed by "0001" (a very small change), high resolution is required. On the other hand, if the transmitted sequences are "0000" followed by "1101" (a large change), lower resolution is sufficient. If mapping from the analog states into the quantized values is made, the MLSE can make a highly accurate decision (since an MLSE is adapted to take the best decisions, based on probabilities rather than on numeric values). This approach saves decisions which may be erroneous (based on numeric values) and leaves the decision to be made by the best tool, which is the MLSE.

Furthermore, this optimization does not involve the quantization output real-valued number, and thereby, significantly reduces the computational complexity.

Since the cost function is highly non-linear and has large number of discontinuities (when. Eq. (12) is calculated over different error events) optimization is obtained by a two-step process of pattern search and iterative local optimizations.

The first step may be regarded as the acquisition part, which includes a derivative free pattern search over all possible thresholds combination (assuming low-resolution, the computation complexity is feasible). The acquisition is made as a first step in order to narrow down the possible range of values of each of the thresholds, and in order to identify the error event of highest probability. Once selected, the second step takes place, which may be regarded as the tracking part. It is performed locally, using the gradient decent algorithm, applied to Eq. (12), to iteratively determine the optimal thresholds.

Figure 4:
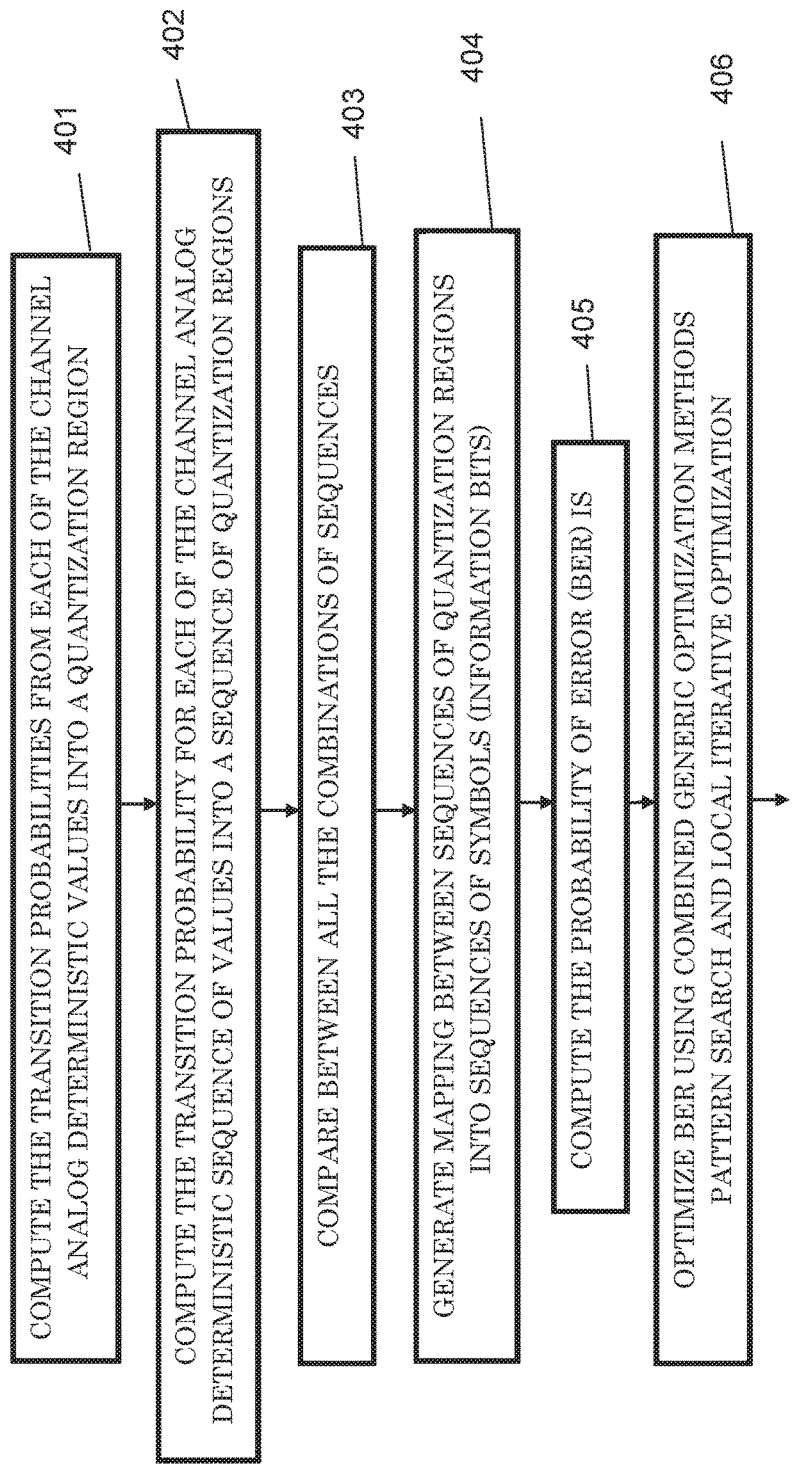
FIG. 4 is a flowchart of the optimization process proposed by the present invention.

FIG. 4 is a flowchart of the optimization process proposed by the present invention. At the first step 401, the transition probabilities from each of the channel analog deterministic values into a quantization region are computed. At the next step 402, the transition probability for each of the channel analog deterministic sequence of values into a sequence of quantization regions is computed. At the next step 403, all the combinations of sequences are compared to each other. At the next step 404, mapping between sequences of quantization regions into sequences of symbols (information bits) is generated. At the next step 405, the probability of error (BER) is computed according to Eq. 11. At the next step 406, the BER is optimized using combined generic optimization methods pattern search and local iterative optimization (e.g., gradient decent).

In order to reduce the complexity of calculations, it is possible to optimize only the worst case. In this case, instead of minimizing the error probability defined by the terms of Eq. 11, it is possible to optimize according to Eq. 12.

It can be seen that the quantization method proposed by the present invention optimizes only the thresholds and not the output levels. This is a significant improvement, since the number of optimization variables decrease by approximately half.

For example, if the ADC has 3 bits, there are $2^3=8$ numeric output values and 7 thresholds, which are 15 variables to be optimized by conventional optimization approaches. On the other hand, the present invention suggests optimizing only the 7 thresholds, which requires significantly less computation (that can be made offline). This entails high accuracy while minimizing the required number of bits.

Results

Simulated results for evaluating the performance of the proposed non-uniform quantization method were obtained by simulation that has been performed for Non-Return-to-Zero On-Off-Keying (NRZ-OOK) modulation, based on Intensity Modulation and Direct Detection transmission (IM-DD). A set of Monte-Carlo simulations demonstrates that the proposed method leads to substantial signal-to-noise-ratio gain, and thus mitigates the penalty usually caused by quantization distortions. The simulated results also show that the MLSE-targeted quantization improves significantly the performance as compared to the MSE-based optimal LM quantizer in term of BER.

Figure 3:
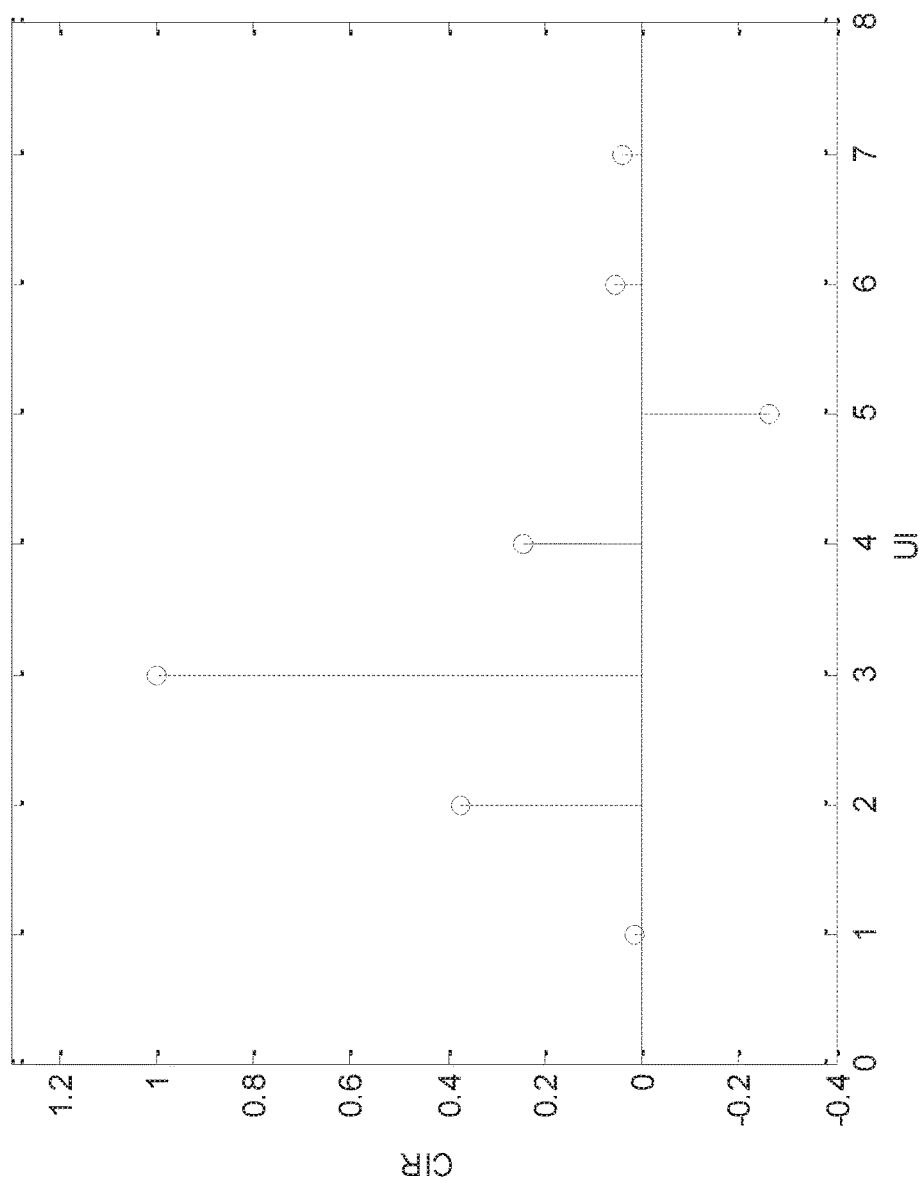
FIG. 3 illustrates the channel impulse response (CIR)

An inclusive set of Monte-Carlo simulations was performed. The model is based on typical datacenters interconnection systems, and includes severely bandlimited optoelectronic and electrical components, and small amount of residual dispersion accumulated over 1 km transmission. It was assumed that the transmitter operates at 56 Gbauds, whereas the overall 3-dB analog bandwidth is approximately 20 GHz. The resulting ISI and Channel Impulse Response (CIR) are illustrated in FIG. 3. Electrical SNR was synthesized by injecting AWGN at the receiving side, immediately after the Optical-to-Electrical Conversion (OEC).

The ADC building block consists of a Track-and-Hold (T&H) circuit; and an amplitude quantizer, with varying threshold levels. The ADC is followed by an MLSE based detector, containing 16 states, which was implemented by means of the histogram estimation method (that is described for example, in "Maximum-Likelihood Sequence Estimation in Dispersive Optical Channels," Agazzi et al, J. Lightwave Technol. 23, 749-(2005).

Simulation results were computed for different number of quantization bits in order to demonstrate the degradation in performance when the ADC resolution is decreased. The results are presented for uniform quantizers and compared with the infinite precision ADC (without quantization distortions).

Figure 5:
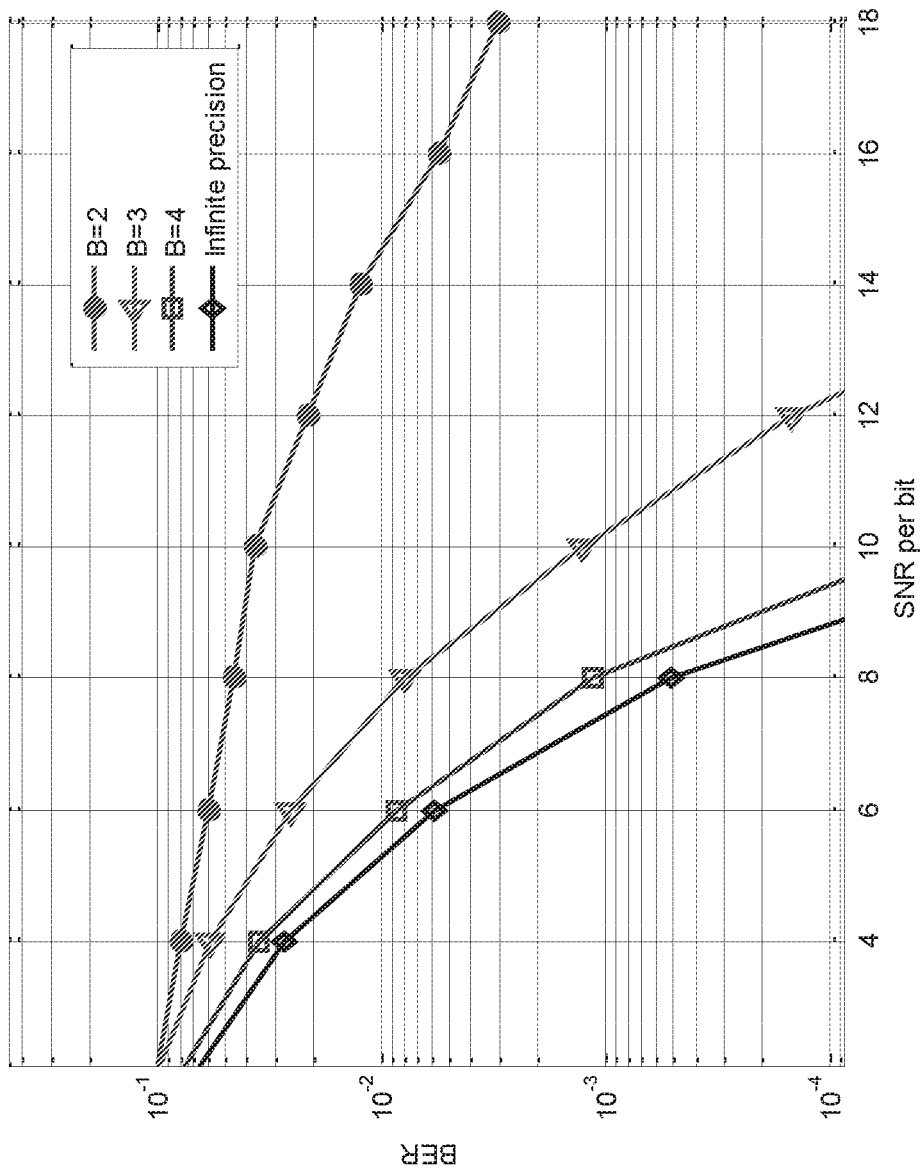
FIG. 5 shows the BER values vs, SNR curves for uniform quantization of 2, 3 and 4 bits uniform ADC.

FIG. 5 shows BER vs. SNR curves for an infinite precision ADC (without ADC quantization), 2 bits uniform ADC, 3 bits uniform ADC and 4 bits uniform ADC respectively. It can be seen that a 4 bits uniform quantization yields relatively small SNR penalty at BER, of 1e-3, which is often considered a threshold for implementing Forward-Error-Correction (FEC) codes. It also supports KP4 FEC, which is the selected FEC scheme for 400 G datacenters connections that requires pre-FEC BER value of 2e-4, with SNR penalty of less than 1 dB. The 3 bits uniform quantizer imposes SNR penalty of approximately 2.5 dB at BER of 1e-3 and 4 dB at BER of 2e-4.

The condition from Eq. (2) is not satisfied for the 2 bits quantizer. In this case, the quantization non-linearity is clearly observed by the slope flattening of the BER curve, due to the signal dependent quantization distortion effect. The BER values are higher than 1e-3 at significantly higher SNR values.

Here a quantitative analysis is performed for the proposed optimal low resolution non-uniform quantizer with MLSE, which is also compared with the LM quantizer and with "standard" uniform quantizer.

Figure 6:
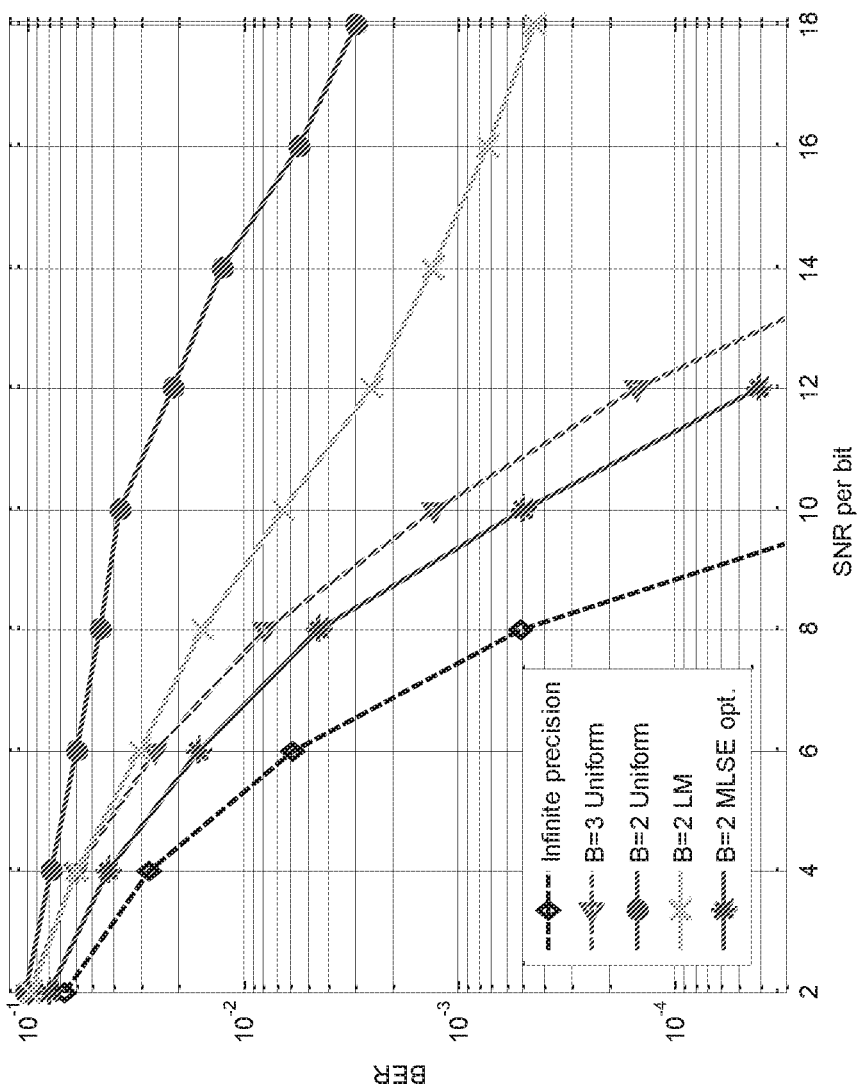
FIG. 6 shows comparison analysis results between uniform and non-uniform quantization.

FIG. 6 summarizes the comparison analysis results, by showing BER vs. SNR curve for an infinite precision ADC, 4 bits uniform ADC, 3 bits uniform ADC and 2 bits uniform, 2 bits Loyd-Max (LM) ADC and MLSE optimal ADC, respectively. It is shown that while using very low resolution ADC of 2-bits only, the proposed method performs surprisingly well and introduces only 1 dB of SNR penalty at BER of $10^{-2}$, as compared to an infinite precision ADC. For comparison, the MSE-based LM quantizer analysis results are presented, indicating that for the case of 2-bits of resolution, a large penalty of 7.5 dB is introduces. The "standard" uniform quantizer case is also presented. As 2-bits ADC does not meet the BER target (shown in the upper curve of FIG. 6), the case of 3-bits of resolution is also analyzed, indicating an SNR penalty of 3dB even though using additional bit as compared to the proposed quantization method. In summary, it is shown that a significant improvement can be achieved if the ADC thresholds are optimally calibrated for the MLSE receiver, based on the minimum BER criterion proposed by the present invention.

While some embodiments of the invention have been described by way of illustration, it will be apparent that the invention can be carried out with many modifications, variations and adaptations, and with the use of numerous equivalents or alternative solutions that are within the scope of persons skilled in the art, without exceeding the scope of the claims.

The invention claimed is:

1. A method for optimizing non-uniform quantization thresholds of an ADC in MLSE-based receivers in an optical communication channel, comprising:
   a) generating a Quantized Noise (QN) distortion model, in which the quantization and the channel additive noises are combined;
   b) applying said model on the channel deterministic analog states x(n) and on sequences of analog states;
   c) calculating transition probabilities from channel deterministic states and sequences of channel deterministic states into the discrete ADC quantization regions;
   d) replacing real value outputs of the ADC by said transition probabilities;
   e) performing non-uniform quantization of the said ADC, with thresholds that are optimized for MLSE detection, to obtain maximal statistical separation;
   f) computing, by a DSP circuit, the MLSE metrics and the transition probabilities of the analog states into the quantized values, for each of the channel deterministic states; and
   g) using an MLSE decoder for post-processing transition probabilities replacing the ADC outputs and representing analog regions, based on the derived transition probabilities.

2. A method according to claim 1, wherein the DSP circuit performs the following steps:
   a) generating the conditional PDFs engines for the MLSE;
   b) computing the transition probabilities from x to r, based on the probability of y(n)=x(n)+z(n) falling within a specific region $r_i$ (quantization bin), and is derived by the probability mass of y(n), accumulated in each of the regions; and
   c) computing the transition probabilities from sequences $=^{(j)}=(x_i^{(j)}, k_2^{(j)} \ldots x_N^{(j)})$ to $R^{(j)}= (r_1^{(j)}r_2^{(j)} \ldots r_N^{(j)})$, as described in the preceding step.

3. A method according to claim 1, wherein quantization is optimized for minimum BER by the following steps:
   a) performing a pattern search over all possible thresholds combination, for narrowing down the possible range of values of each of the thresholds; and
   b) performing iterative local optimizations, using the gradient decent algorithm, to iteratively determine the optimal thresholds.

4. A method according to claim 3, wherein the pattern search and the iterative local optimizations are performed on a target function that incorporates all possible errors.

5. A method according to claim 3, wherein the pattern search and the iterative local optimizations are performed on a target function that incorporates the error with the highest probability.

6. A method according to claim 1, wherein the calculation of the MLSE metrics is based on probability mass of a region, while excluding the arithmetic values of the ADC outputs from calculation.

7. A method according to claim 1, wherein the ADC has non-uniform thresholds which are optimized by minimum BER criterion of the combination of the ADC followed by the MLSE receiver.

8. A method according to claim 1, wherein quantization is represented as a deterministic impairment operating on a noisy signal.

9. A method according to claim 1, wherein the distortion model is defined using transition of probabilities from analog values into quantization regions.

10. An MLSE-based receiver of an optical communication channel, comprising:
    a) an ADC for receiving discrete-time analog values of the received signal, which includes additive noise;
    b) a DSP circuit, for optimizing non-uniform quantization thresholds of said ADC by:

b.1) generating a Quantized Noise (QN) distortion model, in which the quantization and the channel additive noises are combined;

b.2) applying said model on the channel deterministic analog states x(n) and on sequences of analog states;

b.3) calculating transition probabilities from channel deterministic states and sequences of channel deterministic states into the discrete ADC quantization regions;

b.4) replacing real value outputs of the ADC by said transition probabilities;

b.5) performing non-uniform quantization of the said ADC, with thresholds that are optimized for MLSE detection, to obtain maximal statistical separation;

b.6) computing, the MLSE metrics and the transition probabilities of the analog states into the quantized values, for each of the channel deterministic states; and c) an MLSE decoder for post-processing transition probabilities replacing the ADC outputs and representing analog regions, based on MLSE metrics, derived by said. DSP circuit, from the calculated transition probabilities.

11. An MLSE-based receiver according to claim 10, in which the DSP circuit performs the following steps:

a) generating the conditional PDFs engines for the MLSE;

b) computing the transition probabilities from x to r, based on the probability of y(n)=x(n)+z(n) falling within a specific region $r_i$ (quantization bin), and is derived by the probability mass of $y_{(n)}$, accumulated in each of the regions; and c) computing the transition probabilities from sequences $x^{(j)}=(x_1^{(j)}, x_2^{(j)} \ldots x_N^{(j)})$ to $R^{(j)}=(r_1^{(j)}, r_2^{(j)} \ldots r_N^{(j)})$, as described in the preceding step.

12. An MLSE-based receiver according to claim 10, in which quantization is optimized for minimum BER by the following steps:

a) performing a pattern search over all possible thresholds combination, for narrowing down the possible range of values of each of the thresholds; and b) performing iterative local optimizations, using the gradient decent algorithm, to iteratively determine the optimal thresholds.

13. An MLSE-based receiver according to claim 10, in which the calculation of the MLSE metrics is based on probability mass of a region, while excluding the arithmetic values of the ADC outputs from calculation.

14. An MLSE-based receiver according to claim 10, in which the ADC has non-uniform thresholds which are optimized by minimum BER criterion of the combination of the ADC followed by the MLSE receiver.

15. An MLSE-based receiver according to claim 10, in which quantization is represented as a deterministic impairment operating on a noisy signal.

16. An MLSE-based receiver according to claim 10, in which the distortion model is defined using transition of probabilities from analog values into quantization regions.

* * * * *